United States Patent
Al Omari

(10) Patent No.: US 12,188,726 B2
(45) Date of Patent: Jan. 7, 2025

(54) HEAT SINK WITH OPPOSED ELEMENTS PROVIDING TEMPERATURE GRADIENT

(71) Applicant: UNITED ARAB EMIRATES UNIVERSITY, Al Ain (AE)

(72) Inventor: Salah Addin Burhan Al Omari, Al Ain (AE)

(73) Assignee: UNITED ARAB EMIRATES UNIVERSITY, Al Ain (AE)

( * ) Notice: Subject to any disclaimer, the term of this patent is extended or adjusted under 35 U.S.C. 154(b) by 0 days.

(21) Appl. No.: 17/899,590

(22) Filed: Aug. 30, 2022

(65) Prior Publication Data

US 2024/0068756 A1    Feb. 29, 2024

(51) Int. Cl.
*F28D 15/00* (2006.01)
*F28D 15/02* (2006.01)
(Continued)

(52) U.S. Cl.
CPC ..... *F28D 15/0275* (2013.01); *F28D 15/0233* (2013.01); *F28D 15/0266* (2013.01); *F28D 15/043* (2013.01); *F28D 20/025* (2013.01)

(58) Field of Classification Search
CPC ............ F28D 15/0275; F28D 15/0233; F28D 15/0266; F28D 15/043; F28D 20/025; F28D 20/026
See application file for complete search history.

(56) References Cited

U.S. PATENT DOCUMENTS

| 4,323,914 A | 4/1982 | Berndlmaier et al. |
| 6,085,831 A | 7/2000 | DiGiacomo et al. |

(Continued)

FOREIGN PATENT DOCUMENTS

| CN | 201387265 Y | 1/2010 |
| CN | 103759563 A | 4/2014 |

(Continued)

OTHER PUBLICATIONS

JP-2012079858-A: Machine Translation (Year: 2012).*
(Continued)

*Primary Examiner* — Travis Ruby
(74) *Attorney, Agent, or Firm* — Nath, Goldberg & Meyer; Joshua B. Goldberg

(57) ABSTRACT

The heat sink with opposed elements providing a temperature gradient has first and second thermally conductive elements disposed diametrically opposite each other on opposite sides of a chamber filled with a thermally conductive phase change material (PCM). The first and second thermally conductive elements ascend vertically from a thermoconductive base of the PCM chamber, which is adapted for mounting on the case of a heat source, such as an electronic component that generates heat or has heat applied thereto from its surroundings during operation. The first thermally conductive element is maintained hotter than the second thermally conductive element to provide a temperature gradient across the PCM chamber. The PCM melts as heat is absorbed. Convection currents are induced in the melting PCM that facilitate heat absorption from the heat source while maintaining the heat sink at a relatively low temperature by dissipation of heat through the second thermally conductive element.

17 Claims, 5 Drawing Sheets

(51) Int. Cl.
*F28D 15/04* (2006.01)
*F28D 20/02* (2006.01)

(56) References Cited

U.S. PATENT DOCUMENTS

| | | | | |
|---|---|---|---|---|
| 6,725,909 | B1 * | 4/2004 | Luo | H01L 23/427 |
| | | | | 174/15.2 |
| 6,880,346 | B1 * | 4/2005 | Tseng | H10N 10/13 |
| | | | | 257/E23.099 |
| 7,505,269 | B1 * | 3/2009 | Cosley | F28D 15/0275 |
| | | | | 165/104.33 |
| 10,043,732 | B1 | 8/2018 | Al Omari et al. | |
| 10,641,556 | B1 | 5/2020 | Al Omari et al. | |
| 2002/0033247 | A1 | 3/2002 | Neuschutz et al. | |
| 2009/0071628 | A1 | 3/2009 | Jang | |
| 2009/0109623 | A1 * | 4/2009 | Jang | F28D 15/0233 |
| | | | | 165/104.21 |
| 2013/0327502 | A1 * | 12/2013 | Chen | H01L 23/4275 |
| | | | | 165/104.21 |
| 2014/0090808 | A1 * | 4/2014 | Bessho | C09K 5/063 |
| | | | | 165/104.17 |
| 2014/0150996 | A1 * | 6/2014 | Hata | G06F 1/203 |
| | | | | 165/104.26 |
| 2016/0169591 | A1 * | 6/2016 | Thiagarajan | F28D 15/02 |
| | | | | 165/104.21 |
| 2016/0212878 | A1 | 7/2016 | Quinn et al. | |
| 2018/0287231 | A1 | 10/2018 | Iyengar et al. | |
| 2019/0368822 | A1 * | 12/2019 | Hofacker | H05K 7/20936 |
| 2020/0236806 | A1 | 7/2020 | Al Omari et al. | |

FOREIGN PATENT DOCUMENTS

| | | | | |
|---|---|---|---|---|
| JP | 2012079858 A | * | 4/2012 | F28D 15/0275 |
| TW | 200418358 A | | 9/2004 | |

OTHER PUBLICATIONS

Jaworski et al., A novel design of heat sink with PCM for electronics cooling, 10th International Conference on Thermal Energy Storage (2006), 32 pages.

* cited by examiner

HEAT SINK WITH OPPOSED ELEMENTS PROVIDING TEMPERATURE GRADIENT

BACKGROUND

1. Field

The present disclosure relates to a heat sinks, and particularly to a heat sink with opposed elements providing a temperature gradient for enhanced heat transfer through a passively circulated phase change material between the two opposed elements.

2. Description of the Related Art

Heat sinks are used for various purposes, including cooling electronic devices and components. Components that sometimes require heat sinks include central processing units, memory chips, power transistors, and LEDs. These components may generate heat, or have heat applied thereto, in sufficient quantity to make operation erratic or to shorten their useful life. While external devices, such as fans, are used in some applications, it is desired to provide effective extraction of heat by passive means, even if a fan or other cooling device is used to provide overall cooling for the heat sink. Thus, a passive heat sink is often applied directly to the case of such components, transferring heat directly to the sink by conduction and eliminating the heat by transfer to a fluid, such as to a refrigerant or to the air.

There are a great many designs for heat sinks, many very effective. Nevertheless, there is a constant need for new designs to increase the efficiency of heat sinks and to dissipate heat without building up too much heat within the heat sink itself. Thus, a heat sink with opposed elements providing a temperature gradient solving the aforementioned problems is desired.

SUMMARY

The heat sink with opposed elements providing a temperature gradient has first and second thermally conductive elements disposed diametrically opposite each other on opposite sides of a chamber filled with a thermally conductive phase change material (PCM). The first and second thermally conductive elements ascend vertically from a thermoconductive base of the PCM chamber, which is adapted for mounting on the case of a heat source, such as an electronic component that generates heat or has heat applied thereto from its surroundings during operation. The first thermally conductive element is maintained hotter than the second thermally conductive element to provide a temperature gradient across the PCM chamber. The PCM melts as heat is absorbed. Convection currents are induced in the melting PCM that enhance heat absorption from the heat source while maintaining the heat sink at a relatively low temperature by dissipation of heat through the second thermally conductive element.

The first thermally conductive element may or may not be in direct contact with the base of the PCM chamber and extends no higher than the top of the PCM chamber. The first thermally conductive element may be trimmed and thermally insulated at the top of the element to prevent dissipation of heat to the ambient air above the top of the PCM chamber (or dissipation of heat by conduction through the uninsulated top wall of the PCM chamber and thence to ambient air) and to retain heat in the first thermally conductive element so that it has the higher temperature of the two thermally conductive elements. The first thermally conductive element receives heat transferred by conduction from the heat source through the thermally conductive base of the PCM chamber and thence through the bottom of the first element, or by conduction through the base of the PCM chamber and thence through the solid PCM, and subsequently through the side of the first element. The first thermally conductive element may be made from a solid thermally conductive material, such as at least one metal. The first thermally conductive element is maintained with the higher temperature of the two thermally conductive elements.

The second thermally conductive element may be separated from the base of the PCM chamber by a layer of thermal insulation or may be insulated at its lower end or otherwise kept out of direct contact with the base of the PCM chamber so that it is not heated directly by the heat source. The upper end of the second thermally conductive element may extend above the top of the PCM chamber and may be exposed to cool air from a cooling fan. In a first embodiment, the second thermally conductive element may be hollow. such as a vapor chamber or a plurality of pipes (e.g., heat pipes), and may contain a second phase change material having a low boiling point or vaporization temperature (which is higher than the temperature of the ambient air, but lower than prevailing temperatures inside the PCM chamber) so that the second phase change material undergoes cycles of vaporization and condensation as the second thermally conductive element absorbs heat from the PCM chamber and is cooled at its upper end, dissipating heat to the surrounding atmosphere. In a second embodiment, the second thermally conductive element may be a thermally conductive fin that extends above the top of the PCM chamber. In any event, when the second thermally conductive element is hollow and contains a second phase change material, the second phase change material remains separated from the first phase change material in the PCM chamber by the wall of the second thermally conductive element and/or the side wall of the PCM chamber so that the first and second phase change materials never mix.

As heat from the heat source is absorbed by the solid PCM in the PCM chamber, the solid PCM begins to melt, gradually changing to the liquid phase, beginning near the base of the PCM chamber and the higher temperature first thermally conductive element, while the PCM adjacent the top of the chamber and adjacent the lower temperature second thermally conductive element stay solid for a longer period of time. The temperature gradient between the first and second thermally conductive elements causes the PCM in the PCM chamber adjacent the second thermally conductive element to be denser than the PCM in the PCM chamber adjacent the first thermally conductive element. This difference in density results in a difference in buoyant forces as the PCM material in the PCM chamber melts (the PCM material in the PCM chamber also being hotter adjacent the base of the PCM chamber than at the upper end), with consequent circulation of convection currents in the PCM chamber, resulting in enhanced absorption of heat from the heat source and maintenance of lower temperature in the heat sink than with conventional heat sinks, presenting lower resistance to absorption of heat from the heat source.

Thus, the present heat sink has two opposing elements, one hotter than the other. This difference in temperature between the two opposing elements creates a temperature gradient, hence a density difference, and the density difference causes natural circulation due to the effect of buoyancy forces, which helps aiding heat transfer within the molten PCM disposed between the two opposing elements, and ultimately transfers heat effectively from the hot source that requires cooling. It is noted that for circulation to be induced between the opposed elements, the PCM material should be a fluid, which could be in a liquid state, in particular, a molten PCM, but which might also be a gas.

These and other features of the present subject matter will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
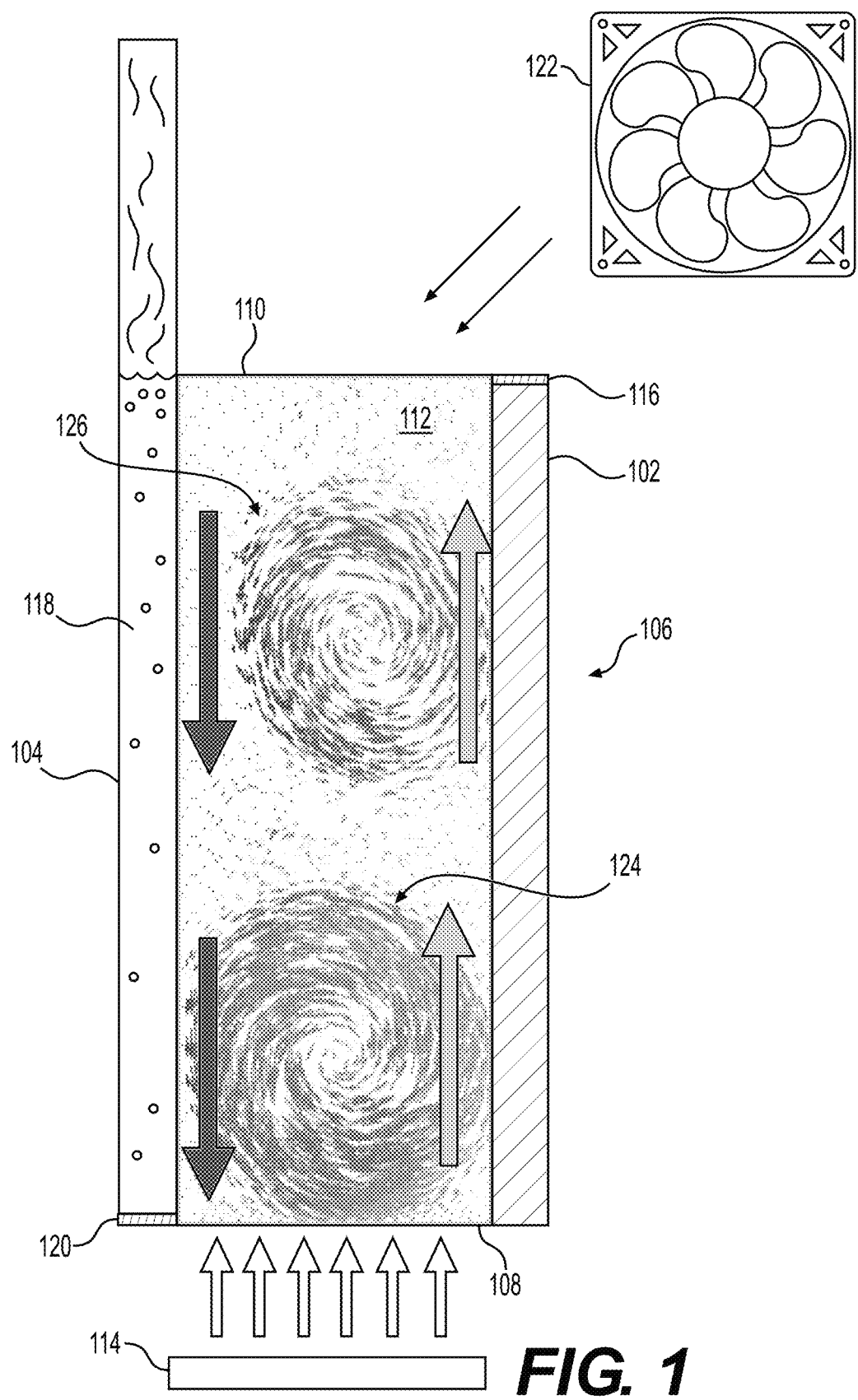
FIG. 1 is a schematic sectional diagram of a first embodiment of a heat sink with opposed elements providing a temperature gradient, in which the second thermally conductive element is hollow and contains a second phase change material.

The heat sink with opposed elements providing a temperature gradient has first and second thermally conductive elements disposed diametrically opposite each other on opposite sides of a chamber filled with a thermally conductive phase change material (PCM). The first and second thermally conductive elements ascend vertically from a thermoconductive base of the PCM chamber, which is adapted for mounting on the case of a heat source, such as an electronic component that generates heat or has heat applied thereto from its surroundings during operation. The first thermally conductive element is maintained hotter than the second thermally conductive element to provide a temperature gradient across the PCM chamber. The PCM melts as heat is absorbed. Convection currents are induced in the melting PCM that enhance heat absorption from the heat source while maintaining the heat sink at a relatively low temperature by dissipation of heat through the second thermally conductive element.

The first thermally conductive element may or may not be in direct contact with the base of the PCM chamber and extends no higher than the top of the PCM chamber. The first thermally conductive element may be trimmed and thermally insulated at the top of the element to prevent dissipation of heat to the ambient air above the top of the PCM chamber (or dissipation of heat by conduction through the uninsulated top wall of the PCM chamber and then to the cooler ambient air above the PCM chamber) and to retain heat in the first thermally conductive element so that it has the higher temperature of the two thermally conductive elements. The first thermally conductive element receives heat transferred by conduction from the heat source through the thermally conductive base of the PCM chamber and thence through the bottom of the first element, or by conduction through the base of the PCM chamber and thence through the PCM, and further through the side of the first element. The first thermally conductive element may be made from a solid thermally conductive material, such as at least one metal. The first thermally conductive element is maintained with the higher temperature of the two thermally conductive elements.

The second thermally conductive element may be separated from the base of the PCM chamber by a layer of thermal insulation or may be insulated at its lower end or otherwise isolated from the base of the PCM chamber so that it is not heated directly by the heat source. The upper end of the second thermally conductive element may extend above the top of the PCM chamber and may be exposed to cool air from a cooling fan. In a first embodiment, the second thermally conductive element may be hollow. such as a vapor chamber or a plurality of pipes (e.g., heat pipes), and may contain a second phase change material having a low boiling point or vaporization temperature (which is higher than the temperature of the ambient air but lower than prevailing temperatures within the PCM chamber) so that the second phase change material undergoes cycles of vaporization and condensation as the second thermally conductive element absorbs heat from PCM in the PCM chamber and is cooled at its upper end, dissipating heat to the surrounding atmosphere. In a second embodiment, the second thermally conductive element may be a thermally conductive fin that extends above the top of the PCM chamber. In any event, when the second thermally conductive element is hollow and contains a second phase change material, the second phase change material remains separated from the first phase change material in the PCM chamber by the wall of the second thermally conductive element and/or the side wall of the PCM chamber so that the first and second phase change materials never mix.

As heat from the heat source is absorbed by the solid PCM in the PCM chamber, the solid PCM begins to melt, gradually changing to the liquid phase, beginning near the base of the PCM chamber and the higher temperature first thermally conductive element, while the PCM adjacent the top of the chamber and adjacent the lower temperature second thermally conductive element stay solid for a longer period of time. The temperature gradient between the first and second thermally conductive elements causes the PCM in the PCM chamber adjacent the second thermally conductive element to be denser than the PCM in the PCM chamber adjacent the first thermally conductive element. This difference in density results in a difference in buoyant forces as the PCM material in the PCM chamber melts (the PCM material in the PCM chamber also being hotter adjacent the base of the PCM chamber than at the upper end), with consequent circulation of convection currents in the PCM chamber, resulting in enhanced absorption of heat from the heat source and maintenance of lower temperature in the heat sink than with conventional heat sinks, presenting lower resistance to absorption of heat from the heat source.

As shown in FIG. 1, the heat sink with opposed elements providing a temperature gradient has a first thermally conductive element 102 and a second thermally conductive element 104 diametrically opposed from the first thermally conductive element 102 attached to opposite sides of a PCM chamber 106 having a thermally conductive base 108, a top wall 110, and side walls. The chamber 106 is filled with a first thermally conductive phase change material (PCM) 112, which is initially in a solid phase but melts to a liquid phase upon absorption of sufficient heat. The first thermally conductive element 102 and the second thermally conductive element 104 may be side walls of the chamber 106, or may be disposed outside the chamber 106 adjacent the side walls and extend vertically from the base 108 to at least the top wall 110 of the chamber 106. The base 108 of the chamber 106 is mounted above and in direct contact with a heat source 114, such as an electronic device or component requiring cooling for proper operation.

The first thermally conductive element 102 may be a rib or stud made from a thermally conductive metal, such as copper, aluminum, or alloys thereof. In some embodiments, the first thermally conductive element 102 may be made of materials having different thermal conductivities stacked at different levels along the height of the element 102 in order to control the degree of height or temperature gradient relative to the second thermally conductive element 104, thereby regulating the temperature in the PCM chamber 106 at different heights in the chamber 106. The first thermally conductive element 102 may be trimmed at its top end and have a layer of thermal insulation 116 at the top of the element 102 to help retain heat absorbed by the element 102 from the heat source 114 through the thermally conductive base 108 in order to maintain the temperature gradient relative to the second thermally conductive element 104.

Preferably, the bottom end of the first thermally conductive element 102 is connected directly to the thermally conductive base 108 that receives the heat from the heat source 114. However, in some configurations, the first thermally conductive element 102 may not be directly connected to the thermally conductive base, leaving only the rest of the vertical side of the first element 102 in direct contact with the PCM in the PCM chamber 106 or the thermally conductive wall of the PCM chamber 106 and receiving heat therefrom. This may depend on the intent of the designer and the anticipated level of temperature gradient, and hence the intensity of internal circulation required inside the chamber 106, as may be dictated by the application(s) at hand.

In the embodiment of the heat sink shown in FIG. 1, the second thermally conductive element 104 is a hollow structure, which may be a vapor chamber hollow from front to back, or an array of heat pipes aligned vertically along the side wall of the PCM chamber 106 (the array of heat pipes may be interconnected with each other by high heat conductivity studs or connecting elements to pass heat easily from one pipe to the other, thus improving operation of heat transfer in the heat sink 100). The hollow structure (vapor chamber or pipes) may contain a second phase change material 118 having a low boiling point or vaporization temperature. Also, the second phase change material 118 can also be a solid PCM with a lower phase change temperature than the phase change temperature of the first PCM 112 within the PCM chamber 106 but higher than ambient air adjacent the second thermally conductive element 104. So, not only a vapor chamber or heat pipes are the options for the second element 104, but also the second element 104 may be a hollow pipe or cavity filled with a lower phase change point solid PCM. Therefore, the main embodiments for the second element 104 are (1) a vapor chamber or a group of interconnected heat pipes filled with a low boiling point liquid PCM, and (2) a solid conducting fin (described below with respect to FIG. 2). The boiling point of the second phase change material 118 should be lower than the temperatures prevailing in the first phase change material 112 within the PCM chamber 108 to ensure that the heat will go from the first PCM material 112 to the second PCM material 118 and subsequently be dissipated to the outer ambient surroundings. The low boiling point or vaporization temperature may be provided by selecting a phase change material having the desired low boiling point or vaporization temperature, or by maintaining the vapor chamber (or pipes) at a pressure sufficient to lower the boiling point or vaporization temperature of the second phase change material 118 to the desired low boiling point or vaporization temperature. The lower end of the second thermally conductive element 104 is insulated from the thermally conductive base 108 of the heat sink 100 by a layer of thermal insulation 120 or may be insulated at its lower end or otherwise isolated from direct contact with the base 108 of the PCM chamber 106. The upper end of the second thermally conductive element 104 may extend above the top 110 of the PCM chamber 106 and may be exposed to cool air from a cooling fan 122 (or the pipes may extend from the top of the chamber 106 and be cooled by the fan 122) to allow condensation and recirculation of the second PCM 118 after dissipation of heat to the cooler ambient air surrounding the heat sink 100.

Figure 3:
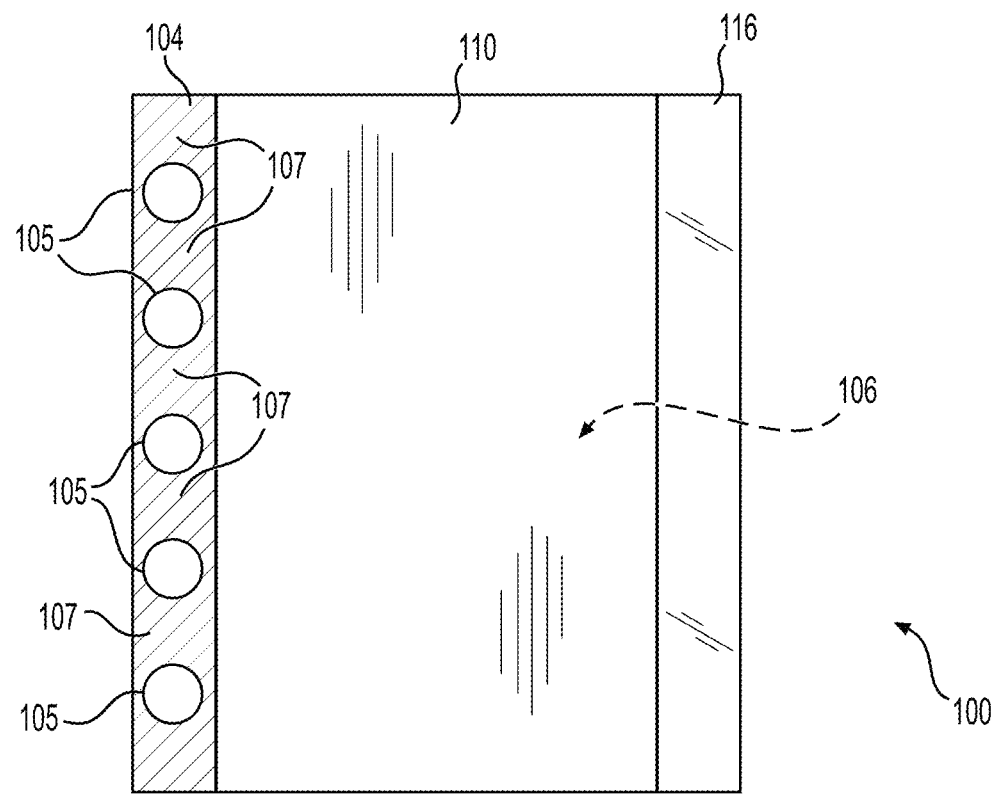
FIG. 3 is a schematic diagram of an embodiment of a heat sink with opposed elements providing a temperature gradient, in which the second thermally conductive element is an array of heat pipes embedded within the high thermal conductivity left wall of the heat sink, as seen from the top of the heat sink.

FIG. 3 shows an embodiment of the heat sink 100 wherein the second thermally conductive element 104 is an array of heat pipes 105 embedded within the wall of the second thermally conductive element 104, which is attached to the thermally conductive side wall of the PCM chamber 106. The upper ends of the heat pipes 105 extend above the top wall 110 of the PCM chamber 106 so that the liquid second PCM 118 in the heat pipes 105 boils after absorption of sufficient heat, the resulting vapor rises in the heat pipes 105 to a height elevated above the PCM chamber 106, dissipates heat to the ambient air (it should be understood that some additional heat is dissipated to ambient air through the thermally conductive wall of the second thermally conductive element 104 as the hot second PCM 118 rises in the heat pipes 105 to a height elevated above the PCM chamber 106), condenses within the heat pipe 105, and falls within the heat pipe 105 to repeat the cycle. Heat may be distributed between adjacent pipes 105 by conduction through the thermally conductive material 107 of the second thermally conductive element wall 104 between pipes 105, or by an interconnecting bar or link extending between pipes 105.

Figure 4:
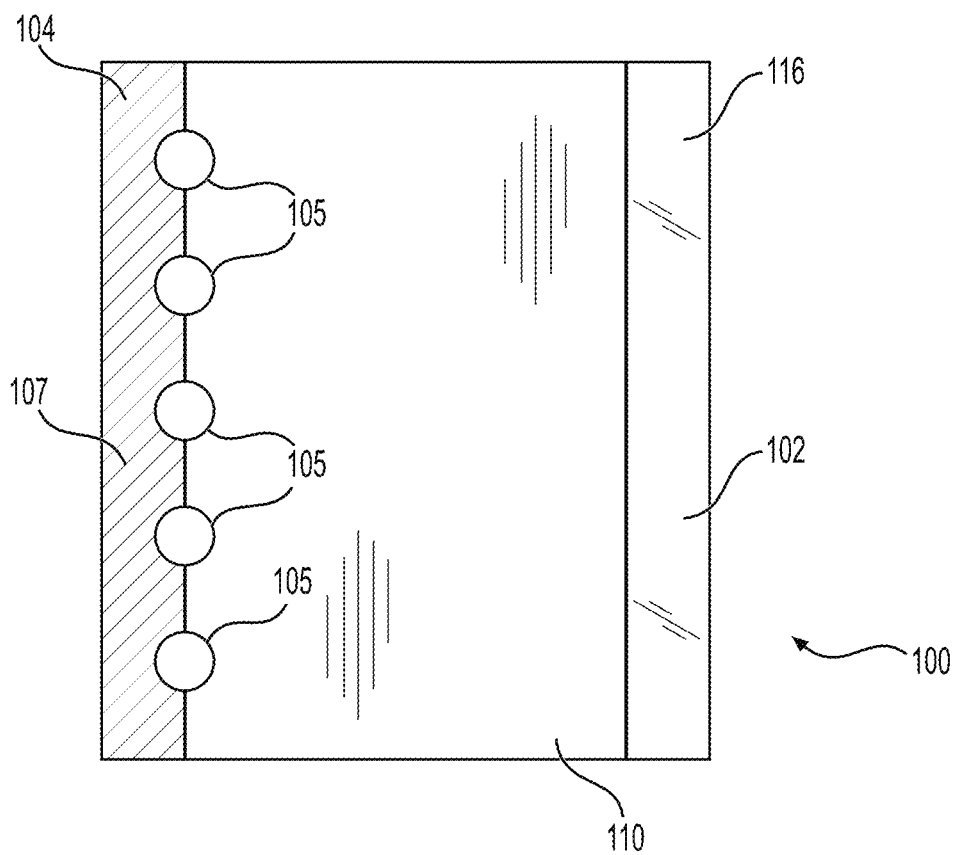
FIG. 4 is a schematic diagram of an embodiment of a heat sink with opposed elements providing a temperature gradient, in which the second thermally conductive element is an array of heat pipes attached to a corrugated wall of the second element, as seen from the top of the heat sink.

FIG. 4 illustrates an example of another embodiment of the second thermally conductive element 104 wherein the second thermally conductive element 104 is an array of heat pipes 105 sandwiched between a corrugated wall of the second thermally conductive element 104 and a corrugated thermally conductive side wall of the PCM chamber 106. Thus, in this embodiment, the heat pipes 105 experience heat transfer directly from the PCM chamber 106 over a radial sector of their circumference, rather than mediately through the wall of the second thermally conductive element 104, for more efficient heat transfer. Otherwise, the structure of the second thermally conductive element 104 is similar to the embodiment of FIG. 3. The upper ends of the heat pipes 105 extend above the top wall 110 of the PCM chamber 106 so that the liquid second PCM 118 in the heat pipes 105 boils after absorption of sufficient heat, etc., and heat may be distributed between adjacent pipes 105 by conduction through the thermally conductive material of the second thermally conductive element wall 104 between pipes 105, or by an interconnecting bar or link extending between pipes 105. It will be understood that the embodiments of FIGS. 1-4 are exemplary only, and that the first and second thermally conductive elements 102, 104 may have any structure or configuration conducive to maintaining a temperature gradient on opposite sides of the PCM chamber 106 to facilitate inducing convection of a current through the molten PCM to promote efficient heat transfer from the heat source 114 through the base 108 of the PCM chamber 106.

In operation, the second thermally conductive element 104 is prevented from absorbing heat directly by conduction through the thermally conductive base 108 of the heat sink 100 by the layer of thermal insulation 120. Instead, the second thermally conductive element 104 absorbs heat by conduction from unmelted PCM in the PCM chamber 106 and by convection due to the induced circulations within the molten phase change material (PCM) 112 in the PCM chamber 106, which has been melted by heat that comes from the hot source 114 below the heat sink and by heat absorbed from the first thermally conductive element 102. Also, the second thermally conductive element 104 absorbs heat by conduction from the unmelted part of the PCM 112 to the second PCM material 118 within the second element 104. The second phase change material 118 undergoes cycles of vaporization and condensation (a process that enhances the absorption of heat) as the second thermally conductive element 104 absorbs heat from the PCM chamber 106 and is cooled at its upper end, dissipating heat to the surrounding atmosphere by exposure of the upper end of the second thermally conductive element 104 to the atmosphere (as well as through the side of the second thermally conductive element 104 exposed to ambient air), which is at a lower temperature than the phase change temperature of the second PCM 118. The effect is to maintain the second thermally conductive element 104 at a lower temperature than the first thermally conductive element 102, ensuring a temperature gradient across the PCM chamber 106.

The temperature gradient between the first and second thermally conductive elements 102, 104 causes the molten part of the PCM 112 in the PCM chamber 106 adjacent the second thermally conductive element 104 to be denser than the molten part of the PCM 112 in the PCM chamber 106 adjacent the first thermally conductive element 102. This difference in density results in a difference in buoyant forces as the PCM material 112 in the PCM chamber 106 melts (the PCM material 112 in the PCM chamber 106 also being hotter adjacent the base 108 of the PCM chamber 106 than at the upper end), with consequent circulation of convection currents in the PCM chamber 106. This distribution may result in the flow of heat upward closely adjacent the first thermally conductive element 102, and a downward flow of cooler PCM 112 closely adjacent the second thermally conductive element 104, and may also result in a vortex of convection currents (depicted schematically at 124 in FIG. 1) in the bottom portion of the PCM chamber 106 and/or a vortex of convection currents (depicted schematically at 126 in FIG. 1) in the upper portion of the PCM chamber 106.

Operation of the first embodiment of the heat sink 100 was tested by numerical computer simulations using the equations of computational fluid dynamics (CFD) on the assumption of a fairly high heat flux of 10 W/cm$^2$. These simulations showed that the maximum temperature of the molten mass of PCM 112 (gallium in this simulation) adjacent the base 108 of the heat sink 100 did not exceed 320 K.

Three reasons may be advanced to explain why the temperature near the base 108 will always stay at low levels (which aids the base 108, and hence the heat source 114 requiring cooling). These reasons include (1) some of the heat will be dissipated to the conducting elements from the circulating molten PCM; (2) some of the heat will be dissipated from the circulating molten PCM to the vapor chamber walls, hence be dissipated to the outer ambient surroundings via the boiling process and the subsequent condensation of the resulting vapor that take place in the vapor chamber (the boiling of the liquid in the vapor chamber is taking place at cooler temperatures than the sink temperature and the ambient surroundings are cooler than the boiling temperature to facilitate effective condensation of resulting vapor); and (3) part of the heat absorbed by the circulating liquid PCM from the source will be conveyed to the un-melted solid PCM at low temperature (i.e., at the nominal melting temperature of the solid PCM in the sink). The above three mechanisms will assure low temperature in the molten PCM body, hence low temperature of the base and consequently of the heat source attached to the base of the sink.

Figure 2:
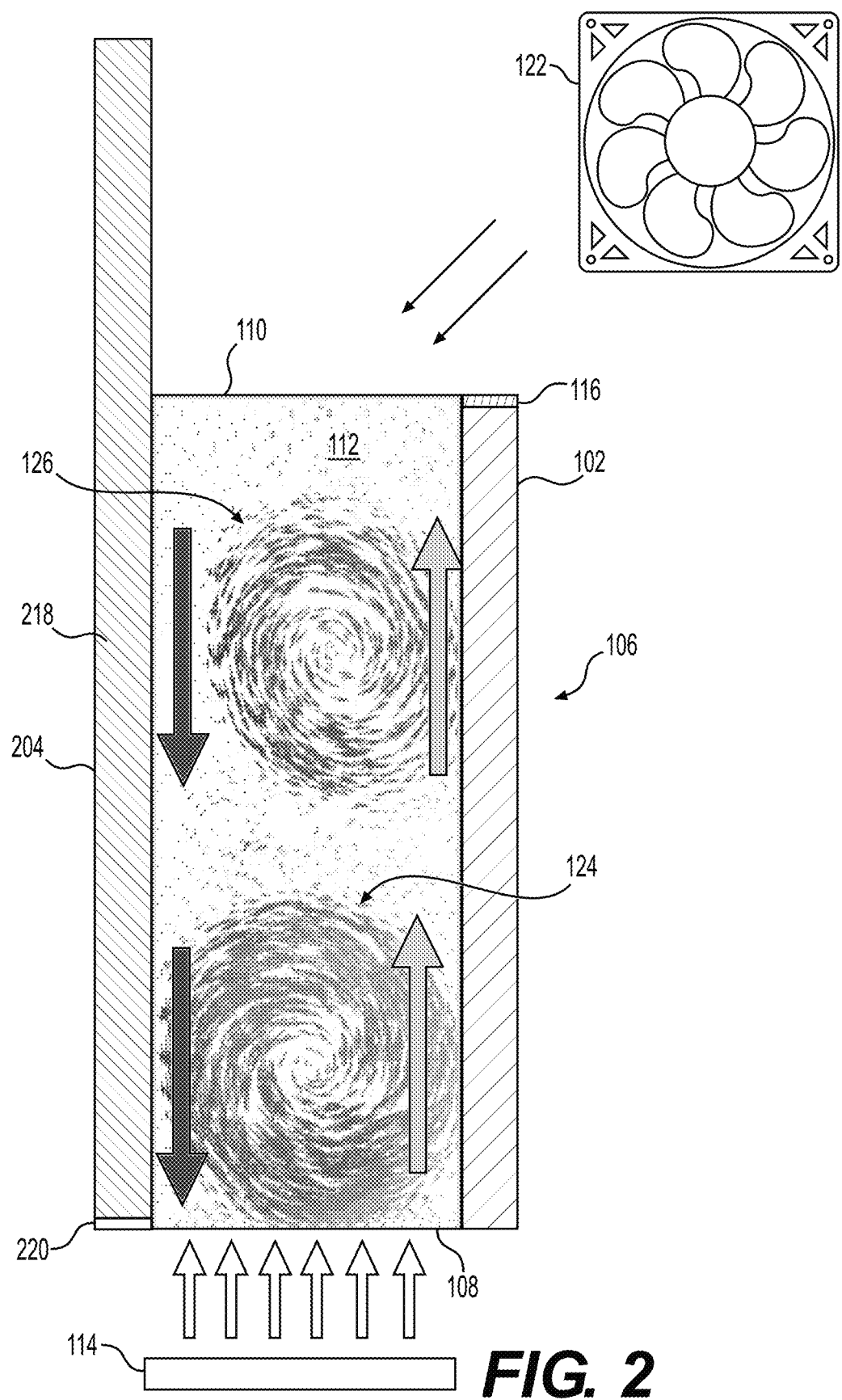
FIG. 2 is a schematic sectional diagram of a second embodiment of a heat sink with opposed elements providing a temperature gradient, in which the second thermally conductive element is a fin.

As shown in FIG. 2, a second embodiment of the heat sink with opposed elements providing a temperature gradient is similar in structure to the first embodiment. However, in this embodiment, the second thermally conductive element 204 is a fin or solid body 218 of thermally conductive material throughout the height of the element. The second thermally conductive element 204 may be made from a thermally conductive metal, such as copper, aluminum, or alloys thereof. The lower end of the second thermally conductive element 204 is thermally isolated from the thermally conductive base 108 of the heat sink, either by being insulated from the thermally conductive base 108 by a layer of thermal insulation 220, by being insulated at its lower end, or by being physically distanced from the thermally conductive base 108 so that the lower end of the second element 204 does not "see" the heat from the base 108, no matter what means is used to thermally isolate the lower end of the second element 204 from the thermally conductive base 108. The upper end of the second thermally conductive element 204 may extend above the top 110 of the PCM chamber 106 and may be exposed to cool air from a cooling fan 122. As in the first embodiment, the isolation of the second thermally conductive element 204 from direct conduction of heat from the heat source 114 through the thermally conductive base 108 by the layer of insulation 220 and the dissipation of heat from the second thermally conductive element 204 through the portion of the fin extending above the top 110 of the PCM chamber 106 and through the side of the second thermally conductive element 204 to ambient air keeps the second thermally conductive element 204 at a cooler temperature than the first thermally conductive element 102, thereby maintaining a heat or temperature gradient across the PCM chamber 106 and inducing convection currents in the PCM 112 as the PCM melts by the absorption of heat from the first thermally conductive element 102 and through the thermally conductive base 108 of the PCM chamber 106, thereby enhancing the absorption of heat from the heat source 114 while keeping the heat sink 200 at a lower temperature than conventional heat sinks, lowering resistance to heat transfer to the heat sink 200.

Figure 5:
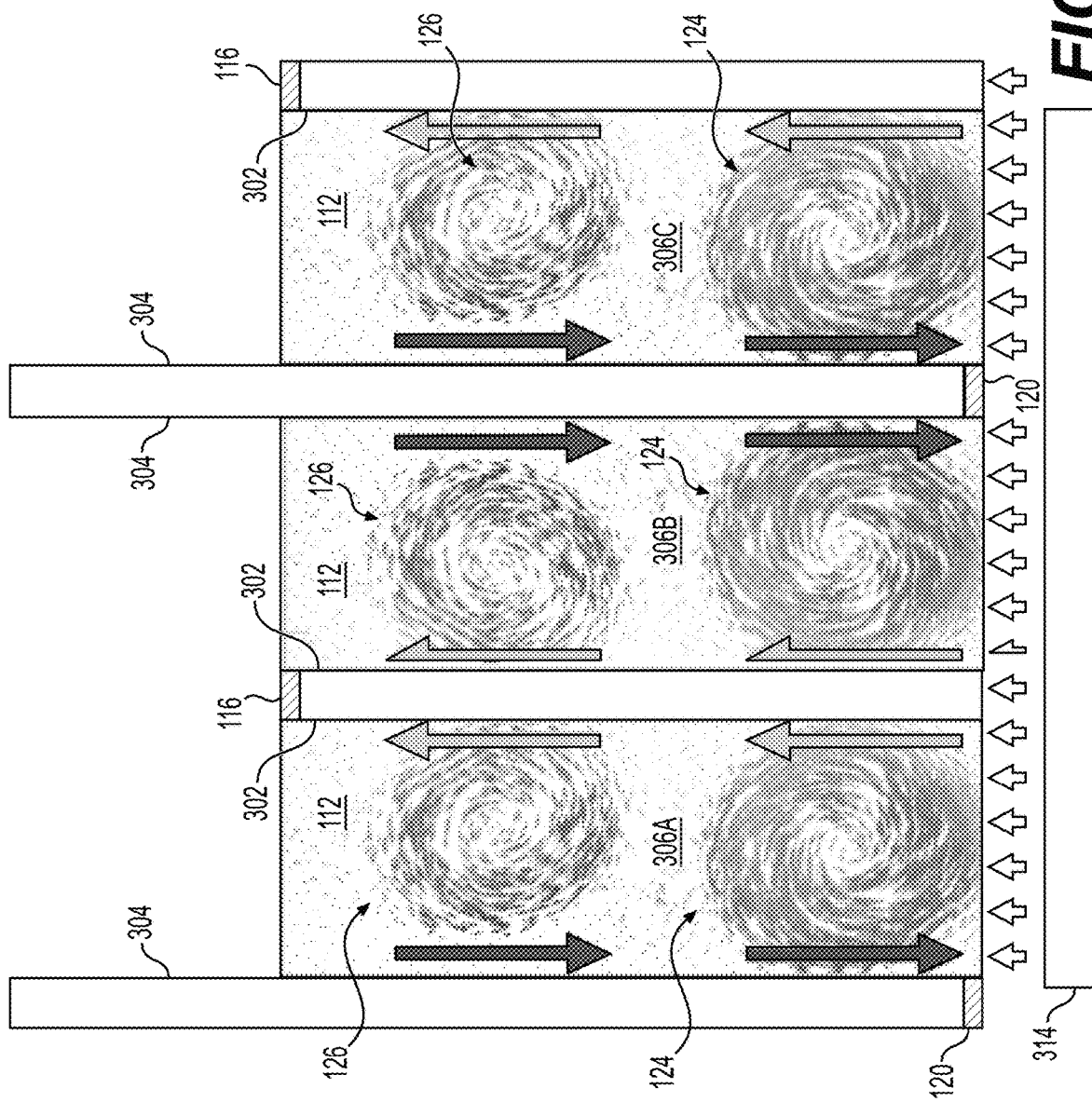
FIG. 5 is a schematic diagram of an embodiment of a heat sink with opposed elements providing a temperature gradient, having multiple units attached side-by-side to extend the width of the heat sink.

It should be noted that although the drawings show a single PCM chamber 106, the heat sink 100 or heat sink 200 may comprise a plurality of PCM chambers 106 of the same construction aligned horizontally or side-by-side over the heat source 114, depending on the required size of the heat sink, as shown in FIG. 5. However, in this configuration, the first thermally conductive element 302 and the second thermally conductive element 304 must alternate the sides of the heat sink chamber 306A, 306B, 306C they are attached to in order to keep heat from the heat source 314 flowing in the same direction. Thus, in FIG. 5, the leftmost heat sink chamber 306A has the first thermally conductive element 302 attached to the right side of the heat sink chamber 306A and the second thermally conductive element 304 attached to the left side of the heat sink chamber 306A. On the other hand, the middle heat sink chamber 306B has the first thermally conductive element 302 attached to the left side of the heat sink chamber 306B and the second thermally conductive element 304 attached to the right side of the heat sink chamber 306B, i.e., adjoining heat sink chambers 306A and 306B have first thermally conductive elements 302 configured back-to-back between them. Similarly, the rightmost heat sink chamber 306C has the first thermally conductive element 302 attached to its right side and the second thermally conductive element 304 attached to its left side, i.e., adjoining heat sink chambers 306B and 306C have second thermally conductive elements 304 configured back-to-back between them. The chain of adjoining heat sink members may be continued to the desired length in the same manner, with adjacent thermally conductive elements of the same kind configured back-to-back (or a single shared thermally conductive element) between them.

It is contemplated that the heat sink with opposed elements providing temperature gradient includes embodiments exhibiting variations in the above description, including: the second element in FIG. 1 may be a series of interconnected heat pipes standing along the vertical side of the heat sink 100 next to the first phase change material 112; the heat pipes may include a liquid that vaporizes and condenses in a manner similar to the liquid disposed in the vertical vapor chamber described above; the second element may be a hollow vertical chamber containing a second solid phase change material that changes phase to a liquid phase upon receiving heat transferred from the first phase change material 112, the second solid phase change material having a phase change temperature (melting point) lower than the melting temperature of the first phase change material 112 but higher than the ambient temperature of the surroundings of the heat sink 100 so that heat may be transferred from the second phase change material to the cooler outer surroundings above the top 110 or on the side of the PCM chamber 106; the second solid phase change material, instead of changing phase to a liquid state, may change phase to a different solid phase upon receiving heat transferred from the first phase change material 112; the second element 104 may be a plurality of compartments stacked vertically, each of the stacked compartments containing different PCMs having different melting temperatures covering a range of melting or phase change temperatures to control the height at which heat is transferred from the first phase change material 112 to the second element 104, depending on the need and the desired heat removal rate from different segments of the first phase change material 112; and additional fins, area corrugations, or extensions can be added to the outer side surface of the second element 104 to help the second element 104 to lose its heat to the outer surroundings at a higher rate, i.e., helping the second element 104 to be cooled more quickly, but not relying solely on losing heat through the upper part of the second element 104 to the outer surroundings.

It is to be understood that the heat sink with opposed elements providing temperature gradient is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:

1. A heat sink with opposed elements including a first thermally conductive element and a second thermally conductive element providing a temperature gradient, said heat sink comprising:
    a phase change material (PCM) chamber having a top wall, side walls, and a thermally conductive base adapted for mounting on a heat source requiring cooling;
    the first thermally conductive element attached to a side of the PCM chamber and extending vertically between the base and the top wall of the PCM chamber;
    the second thermally conductive element attached to a side of the PCM chamber and extending vertically opposite the first thermally conductive element such that the second thermally conductive element does not absorb heat directly from the heat source, the second thermally conductive element having an upper end extending externally above a top wall of the PCM chamber, said upper end extending externally above said top wall of the PCM chamber being exposed to ambient air;
    a thermally conductive first phase change material (PCM) disposed in the PCM chamber and configured to be subjected to heat flux levels, the first PCM having a phase change temperature at which the first PCM melts and changes from solid phase to liquid phase upon absorption of heat to which the first PCM is subjected directly; and
    a cooling fan disposed above the top wall of the PCM chamber, the cooling fan being configured to blow cooling air against the upper end of the second thermally conductive element extending above the top wall of the PCM chamber to dissipate heat from the second thermally conductive element to the ambient air and to provide a temperature gradient extending across the PCM chamber between the first thermally conductive element and the second thermally conductive element, wherein the second thermally conductive element is positioned in the heat sink such that the second thermally conductive element only receives heat from the PCM after heat is absorbed by the PCM; and
    a layer of thermal insulation disposed between a lower end of the second thermally conductive element and the base of the PCM chamber to reduce direct heat transfer from the base to the lower end of second thermally conductive element, the second thermally conductive element being heated by heat transfer from the first phase change material in the PCM chamber, the heat transfer being enhanced by circulation of the first phase change material in the liquid phase in the PCM chamber,
    whereby the temperature gradient produces a vortex of convection currents in the phase change material as the phase change material melts and changes from the solid phase to the liquid phase by absorption of heat from the base of the PCM chamber and from the first thermally conductive element to enhance heat transfer from the heat source to the heat sink.

2. The heat sink according to claim 1, wherein the first thermally conductive element has a top surface, the heat sink further comprising a layer of thermal insulation disposed on the top surface of the first thermally conductive element to retain heat in the first thermally conductive element.

3. The heat sink according to claim 1, wherein said second thermally conductive element is hollow.

4. The heat sink according to claim 3, further comprising a second phase change material disposed in said hollow second thermally conductive element.

5. The heat sink according to claim 4, wherein said second phase change material is a liquid PCM having a phase change temperature below the phase change temperature of said first phase change material, said second phase change material cycling between boiling and condensation in the cooler upper end of said second thermally conductive element, the cycling between boiling and condensation enhancing absorption of heat from said first phase change material.

6. The heat sink according to claim 4, wherein said second phase change material is a liquid PCM maintained in said hollow second thermally conductive element under a pressure sufficient to lower the boiling point of said second phase change material below the phase change temperature of said first phase change material in the PCM chamber, said second phase change material cycling between boiling in said second thermally conductive element adjacent the PCM chamber and condensation in the cooler upper end of said second thermally conductive element, the cycling between boiling and condensation enhancing absorption of heat from the phase change material in the PCM chamber.

7. The heat sink according to claim 4, wherein said second phase change material is a solid PCM having a phase change temperature below the phase change temperature of said first phase change material, said second phase change material changing from a solid phase to a liquid phase at its phase change temperature.

8. The heat sink according to claim 4, wherein said second phase change material is a solid PCM having a phase change temperature below the phase change temperature of said first phase change material, said second phase change material changing from a first solid phase to a different solid phase at its phase change temperature.

9. The heat sink according to claim 4, wherein said hollow second thermally conductive element comprises a vapor chamber.

10. The heat sink according to claim 4, wherein said hollow second thermally conductive element comprises an array of heat pipes.

11. The heat sink according to claim 1, wherein said second thermally conductive element comprises a fin of solid material throughout, including the upper end extending above the top wall of said PCM chamber.

12. The heat sink according to claim 1, wherein said first thermally conductive element comprises a fin made of at least one thermally conductive metal.

13. The heat sink according to claim 1, wherein said first thermally conductive element comprises a fin made of at least two metals having different thermal conductivities stacked at different height levels of said first thermally conductive element in order to regulate the temperature gradient at different height levels of said PCM chamber.

14. The heat sink according to claim 1, wherein second thermally conductive element comprises a fin made of at least two metals having different thermal conductivities stacked at different height levels of said second thermally conductive element in order to regulate the temperature gradient at different height levels of said PCM chamber.

15. The heat sink according to claim 1, wherein said first thermally conductive element comprises a first side wall of said PCM chamber and said second thermally conductive element comprises an opposing second side wall of said PCM chamber.

16. The heat sink according to claim 1, wherein said first thermally conductive element comprises a stud made of at least one thermally conductive metal.

17. The heat sink according to claim 1, wherein the heat source requiring cooling is an electronic device.

\* \* \* \* \*